(12) United States Patent
Hong et al.

(10) Patent No.: US 11,678,513 B2
(45) Date of Patent: Jun. 13, 2023

(54) DISPLAY DEVICE

(71) Applicant: LG Display Co., Ltd., Seoul (KR)

(72) Inventors: Soon-Hwan Hong, Goyang-si (KR);
Kyung-Ah Chin, Paju-si (KR);
Seong-Yeong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 241 days.

(21) Appl. No.: 17/134,342

(22) Filed: Dec. 26, 2020

(65) Prior Publication Data
US 2021/0202918 A1    Jul. 1, 2021

(30) Foreign Application Priority Data

Dec. 27, 2019 (KR) .................. 10-2019-0177054

(51) Int. Cl.
*H10K 50/86* (2023.01)
*G02F 1/1335* (2006.01)
*H10K 59/38* (2023.01)
*H01L 51/52* (2006.01)
*H01L 27/32* (2006.01)

(52) U.S. Cl.
CPC .... *H01L 51/5284* (2013.01); *G02F 1/133512* (2013.01); *G02F 1/133514* (2013.01); *H01L 27/322* (2013.01)

(58) Field of Classification Search
CPC ......... G02F 1/133512; G02F 1/133514; H01L 51/5284; H01L 51/5281; H01L 27/3216; H01L 27/3211; H01L 27/3218; H01L 27/322

See application file for complete search history.

(56) References Cited

U.S. PATENT DOCUMENTS

| | | | | |
|---|---|---|---|---|
| 2005/0139834 A1* | 6/2005 | Park | ................. | H10K 59/38 438/149 |
| 2011/0149213 A1* | 6/2011 | Han | ................. | G02F 1/133514 349/106 |
| 2013/0077284 A1* | 3/2013 | Chang | ................. | G02B 27/0101 362/19 |
| 2015/0138480 A1* | 5/2015 | Yi | ................. | G02F 1/133514 349/44 |
| 2016/0203778 A1* | 7/2016 | Matsui | ................. | G09G 3/3607 345/690 |
| 2018/0275431 A1* | 9/2018 | Hsu | ................. | G02F 1/133512 |
| 2019/0094609 A1* | 3/2019 | Bian | ................. | G02F 1/133526 |

FOREIGN PATENT DOCUMENTS

| | | |
|---|---|---|
| KR | 10-1207145 B1 | 12/2012 |
| KR | 10-1322982 B1 | 10/2013 |
| KR | 10-2014-0027699 A | 3/2014 |
| KR | 10-2016-0071273 A | 6/2016 |
| KR | 10-2018-0049326 A | 5/2018 |
| KR | 10-1975698 B1 | 5/2019 |
| KR | 10-2019-0081768 A | 7/2019 |
| KR | 10-2019-0099304 A | 8/2019 |

* cited by examiner

*Primary Examiner* — Jonathan Y Jung
(74) *Attorney, Agent, or Firm* — Polsinelli PC

(57) ABSTRACT

A display device includes a substrate, sub-pixels on the substrate, a passivation layer on the sub-pixels, and an emitted light control layer on the passivation layer to define a non-emissive area between the sub-pixels, wherein the emitted light control layer includes black matrix layers divided into at least two layers.

18 Claims, 17 Drawing Sheets

(a)

(b)

(c)

(d)

(e)

(f)

(g)

(h)

ature

DISPLAY DEVICE

CROSS-REFERENCE TO RELATED APPLICATION

This application claims the benefit of Korean Patent Application No. 10-2019-0177054, filed on Dec. 27, 2019, which is hereby incorporated by reference in its entirety.

BACKGROUND

Field of the Disclosure

The present disclosure relates to a display device.

Description of the Background

With the development of information technologies, markets of display devices that are connection media between a user and information have expanded. Thus, display devices such as an organic light emitting display (OLED), a quantum dot display (QDD), a liquid crystal display (LCD), and a plasma display panel (PDP) have been increasingly used.

Some of the aforementioned display devices, for example, the LCD or the OLED include a display panel including a plurality of sub-pixels arranged in a matrix form, a driver for outputting a driving signal for driving the display panel, and a power supply for generating power to be supplied to the display panel or the driver. The driver includes a scan driver for supplying a scan signal (or a gate signal) to the display panel, and a data driver for supplying a data signal to the display panel.

The aforementioned display device displays an image by enabling a selected sub-pixel to transmit light therethrough or to directly emit light when a driving signal, e.g., a scan signal and a data signal is supplied to sub-pixels formed on a display panel.

SUMMARY

Accordingly, the present disclosure is to overcome a problem in that an image displayed on a screen is reflected on an unwanted area, a problem in terms of degraded image quality, a problem in terms of degraded brightness, and a problem in terms of increase in the thickness of a product, and also provides an optimum image.

In an aspect, the present disclosure provides a display device including a substrate, sub-pixels on the substrate, a passivation layer on the sub-pixels, and an emitted light control layer on the passivation layer to define a non-emissive area between the sub-pixels, wherein the emitted light control layer includes black matrix layers divided into at least two layers.

The emitted light control layer may include a first black matrix layer positioned on the passivation layer, a first cover layer positioned on the first black matrix layer, a second black matrix layer positioned on the first cover layer, and a second cover layer positioned on the second black matrix layer.

The first black matrix layer and the second black matrix layer may have the same width and length in a display area.

The first black matrix layer and the second black matrix layer may have a region that overlaps with the sub-pixels or do not overlap with the sub-pixels.

The sub-pixels may include a red sub-pixel, a green sub-pixel, and a blue sub-pixel, the red sub-pixel, the green sub-pixel, and the blue sub-pixel may be arranged in a vertical direction and configure one pixel, and the red sub-pixel, the green sub-pixel, and the blue sub-pixel may have sizes that are increased in a stated order.

The red sub-pixel, the green sub-pixel, and the blue sub-pixel may have a trapezoid shape or a rectangular shape with a longer horizontal length than a vertical length.

The red sub-pixel, the green sub-pixel, and the blue sub-pixel may be aligned based on a central area of a reference sub-pixel, one end of the reference sub-pixel, or the other end of the reference sub-pixel.

Sub-pixels included in the one pixel may be summed in a vertical direction to achieve a trapezoid shape.

The one pixel as an assembly of the red sub-pixel, the green sub-pixel, and the blue sub-pixel may have a trapezoid shape.

The one pixel as an assembly of the red sub-pixel, the green sub-pixel, and the blue sub-pixel may have a stepped shape.

The one pixel as an assembly of the red sub-pixel, the green sub-pixel, and the blue sub-pixel may have a concave or convex central portion compared with an upper end or a lower end.

Two pixels adjacent in a horizontal direction of the substrate may include a first group including two sub-pixels that emit light with different colors on the same line, and a second group including two sub-pixels that emit light with the same color on the same line, and the sub-pixels of the first group may be the red sub-pixel and the blue sub-pixel, and the sub-pixels of the second group may be the green sub-pixel.

The display device may further include a polarizer plate positioned on the emitted light control layer.

The sub-pixels may emit one of red, green, and blue light based on a color filter layer on an emissive layer that emits red, green, and blue light or emits white light.

In another aspect, the present disclosure provides a display device including a display panel including sub-pixels, a first black matrix layer positioned on a passivation layer of the display panel, a first cover layer positioned on the first black matrix layer, a second black matrix layer positioned on the first cover layer, and a second cover layer positioned on the second black matrix layer, wherein the first black matrix layer and the second black matrix layer have the same width and the same length in a display area of the display panel.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Reference will now be made in detail aspects of the disclosure examples of which are illustrated in the accompanying drawings.

With the development of information technologies, markets of display devices that are connection media between a user and information have expanded. Thus, display devices such as a quantum dot display (QDD), a liquid crystal display (LCD), an organic light emitting display (OLED), and a plasma display panel (PDP) have been increasingly used.

Some of the aforementioned display devices, for example, the LCD or the OLED include a display panel including a plurality of sub-pixels arranged in a matrix form, a driver for outputting a driving signal for driving the display panel, and a power supply for generating power to be supplied to the display panel or the driver. The driver includes a scan driver for supplying a scan signal (or a gate signal) to the display panel, and a data driver for supplying a data signal to the display panel.

The aforementioned display device displays an image by enabling a selected sub-pixel to transmit light therethrough or to directly emit light when a driving signal, e.g., a scan signal and a data signal is supplied to sub-pixels formed on a display panel. Hereinafter, an LCD and an OLED will be described with regard to exemplary aspects of the present disclosure. Needless to say, the present disclosure may also be applied to a display device based on an inorganic light emitting diode but not an organic light emitting diode.

Figure 1:
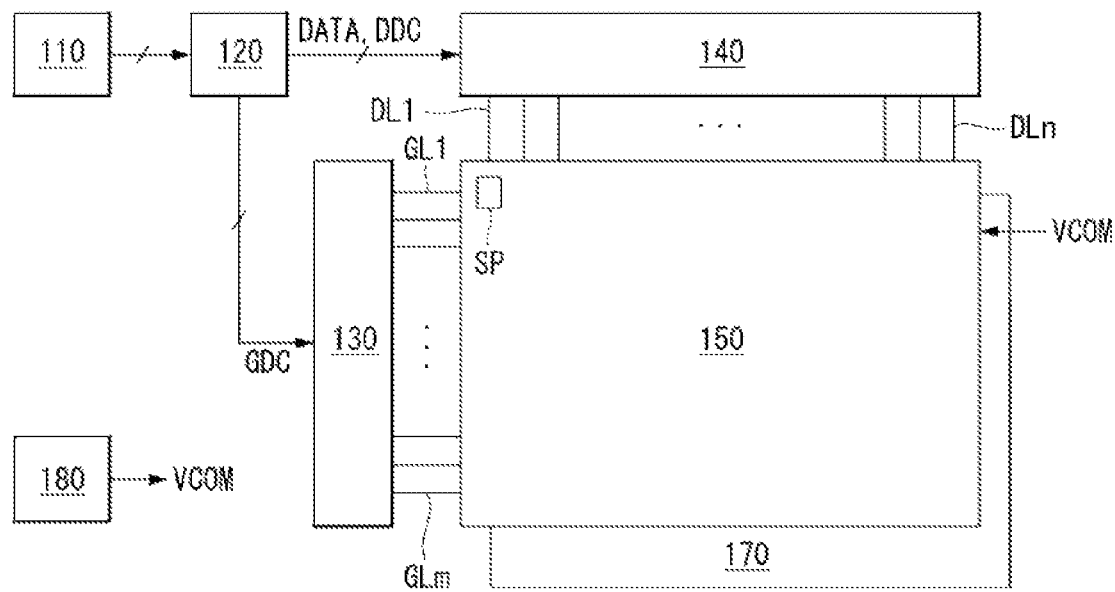
FIG. 1 is a schematic block diagram of a liquid crystal display (LCD)
Figure 2:
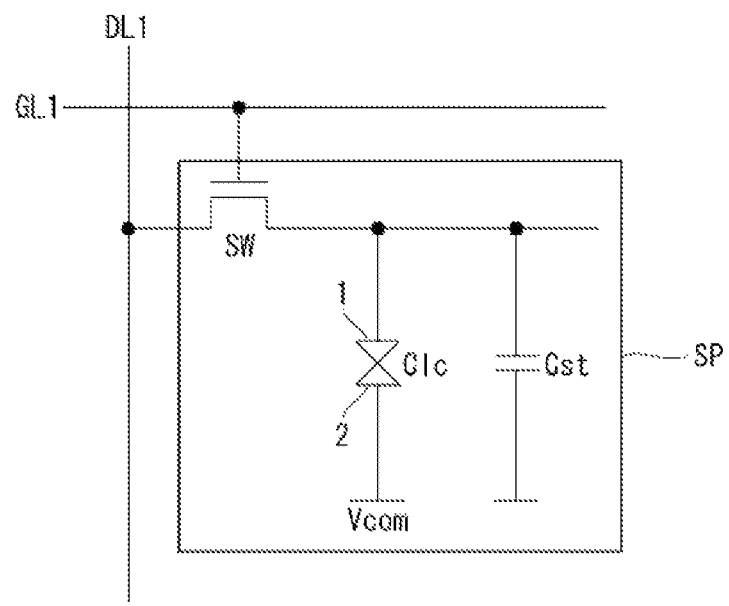
FIG. 2 is a schematic circuit diagram of a sub-pixel shown in FIG. 1.

FIG. 1 is a schematic block diagram of a liquid crystal display (LCD), and FIG. 2 is a schematic circuit diagram of a sub-pixel shown in FIG. 1.

As shown in FIGS. 1 and 2, the LCD may include an image supply 110, a timing controller 120, a scan driver 130, a data driver 140, a display panel 150, a backlight unit 170, and a power supply 180.

The image supply 110 may output various driving signals with an image data signal supplied from the outside or an image data signal stored in an internal memory. The image supply 110 may supply a data signal and various driving signals to the timing controller 120.

The timing controller 120 may output a gate timing control signal GDC for controlling operation timing of the scan driver 130, a data timing control signal DDC for controlling operation timing of the data driver 140, and various synchronization signals (vertical synchronization signal Vsync and horizontal synchronization signal Hsync). The timing controller 120 may supply the data signal DATA supplied from the image supply 110 with the data timing control signal DDC to the data driver 140.

The scan driver 130 may output the scan signal (or a gate signal) in response to the gate timing control signal GDC or the like, which is supplied from the timing controller 120. The scan driver 130 may supply the scan signal to sub-pixels included in the display panel 150 through gate lines GL1 to GLm. The scan driver 130 may be formed in the form of an integrated circuit (IC) or may be directly formed on the display panel 150 in a gate in panel method.

The data driver 140 may sample and latch a data signal DATA in response to the data timing control signal DDC or the like supplied from the timing controller 120, may convert the data signal DATA into a data voltage in the form of an analog signal corresponding to a gamma reference voltage, and may output the data voltage. The data driver 140 may supply a data voltage to sub-pixels included in the display panel 150 through data lines DL1 to DLn. The data driver 140 may be formed in the form of an integrated circuit (IC) and may be installed on the display panel 150 or may be installed on a printed circuit board, but the present disclosure is not limited thereto.

The power supply 180 may generate and output a common voltage $V_{COM}$ based on an external input voltage supplied from the outside. The power supply 180 may generate and output a voltage (e.g., a scan high voltage or a scan low voltage) required to drive the scan driver 130 or a voltage (a drain voltage or a half drain voltage) required to drive the data driver 140 as well as the common voltage $V_{COM}$.

The display panel 150 may display an image in response to a scan signal supplied from the scan driver 130, a data voltage supplied from the data driver 140, and the common voltage $V_{COM}$ supplied from the power supply 180. Sub-pixels of the display panel 150 may control light provided through the backlight unit 170.

For example, one sub-pixel SP may include a switching transistor SW, a storage capacitor Cst, and a liquid crystal layer Clc. A gate electrode of the switching transistor SW may be connected to a scan line GL1, and a source electrode may be connected to a data line DL1. The storage capacitor Cst may have one end connected to the drain electrode of the switching transistor SW and the other end connected to the common voltage line $V_{COM}$. The liquid crystal layer Clc may be formed between a pixel electrode 1 connected to the drain electrode of the switching transistor SW and a common electrode 2 connected to the common voltage line $V_{COM}$.

The display panel 150 may be embodied in a twisted nematic (TN) mode, a vertical alignment (VA) mode, a in plane switching (IPS) mode, a fringe field switching (FFS) mode, an electrically controlled birefringence (ECB), or the like depending on a structure of the pixel electrode 1 and the common electrode 2.

The backlight unit 170 may provide light to the display panel 150 using a light source that emits light. The backlight unit 170 may include an light emitting diode (hereinafter LED), an LED driver for driving the LED, an LED substrate on which the LED is installed, a light guide plate for converting light emitted from the LED into a plane light source, a reflective plate for reflecting light from a lower portion of the light guide plate, optical sheets for focusing and diffusing the light emitted from the light guide plate, and the like, but the present disclosure is not limited thereto.

Figure 3:
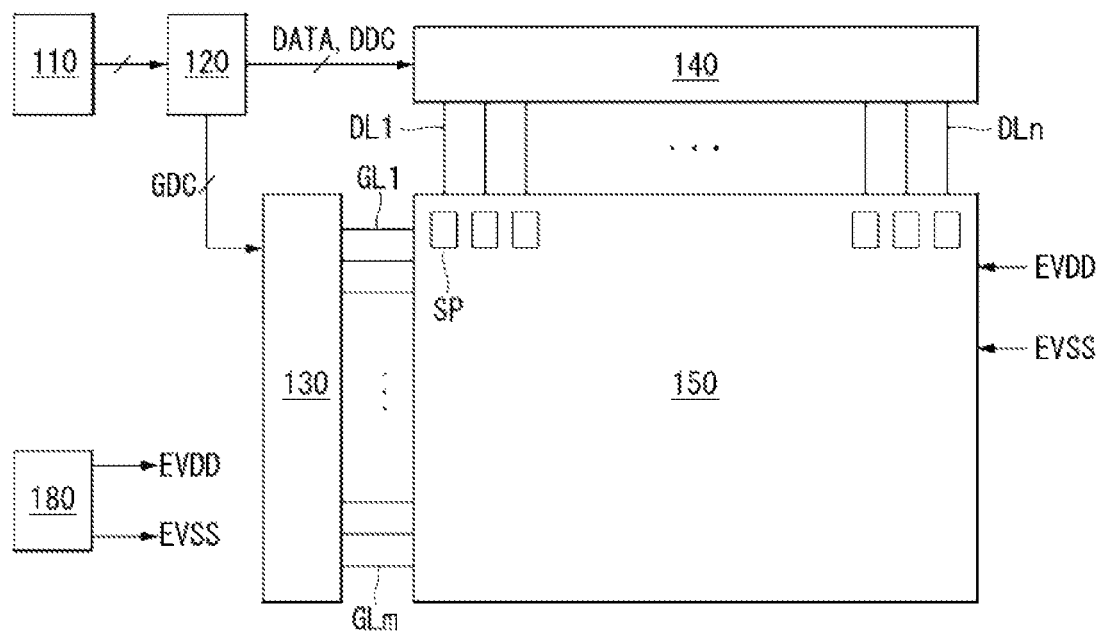
FIG. 3 is a schematic block diagram illustrating an organic light emitting display (OLED)
Figure 4:
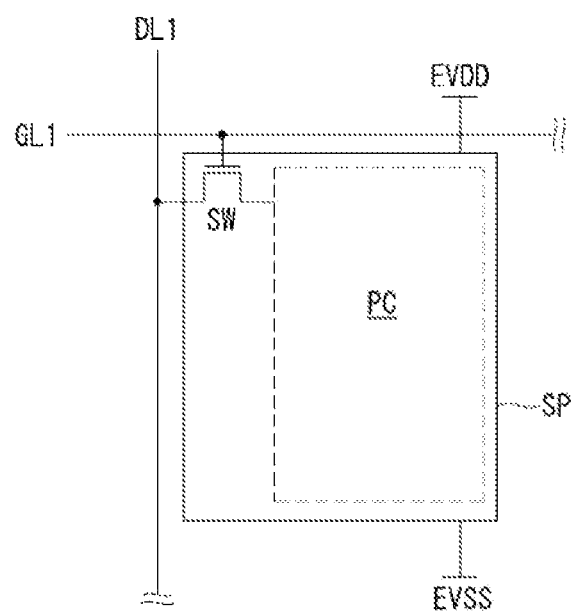
FIG. 4 is a schematic diagram showing a structure of a sub-pixel shown in FIG. 3.

FIG. 3 is a schematic block diagram illustrating an organic light emitting display (OLED), and FIG. 4 is a schematic diagram showing a structure of a sub-pixel shown in FIG. 3.

As shown in FIGS. 3 and 4, the OLED may include the image supply 110, the timing controller 120, the scan driver 130, the data driver 140, the display panel 150, and the power supply 180.

The image supply 110, the timing controller 120, the scan driver 130, and the data driver 140 included in the OLED may have similar structures and operations as the LCD of FIG. 1, and thus, a detailed description thereof will be omitted. Instead, the power supply 180 and the display panel 150 that are most different from the LCD will be described in more detail.

The power supply 180 may generate and output a first driving voltage EVDD of a high potential and a second driving voltage EVSS of a low potential based on an external input voltage supplied from the outside. The power supply 180 may generate and output a voltage (e.g., a scan high voltage or a scan low voltage) required to drive the scan driver 130 or a voltage (a drain voltage or a half drain voltage) required to drive the data driver 140 as well as the first and second driving voltages (EVDD and EVSS).

The display panel 150 may display an image in response to a scan signal output from the driver including the scan driver 130 and the data driver 140, the driving signal including the data voltage, and the first and second driving voltages EVDD and EVSS output from the power supply 180. The sub-pixels of the display panel 150 may directly emit light.

For example, one sub-pixel SP may include the switching transistor SW, and pixel circuit PC including a driving transistor, a storage capacitor, an organic light emitting diode, or the like. The sub-pixel SP used in the OLED may directly emit light and may have a complicated circuit structure compared with a liquid crystal display. In addition, a compensation circuit for compensating for degradation of a driving transistor for supplying driving current to an organic light emitting diode as well as the organic light emitting diode for emitting light may be complicated and diversified. Thus, it may be noted that the pixel circuit PC included in the sub-pixel SP is illustrated in the form of a block.

Figure 5:
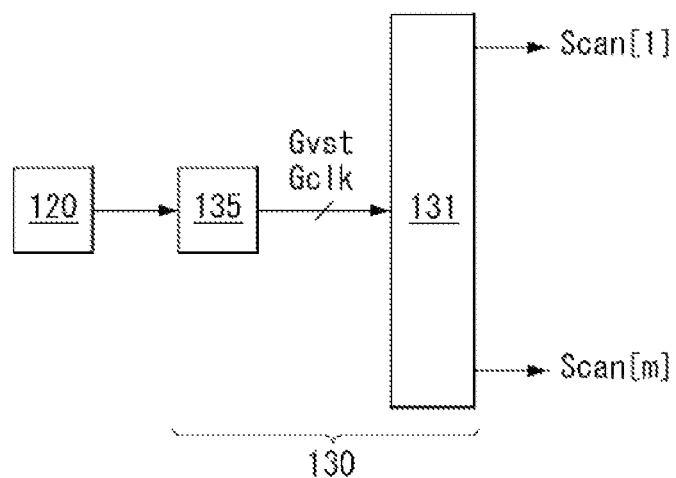
FIG. 5 is a diagram showing a first example of a structure of a device related to a gate in panel type scan driver.
Figure 6:
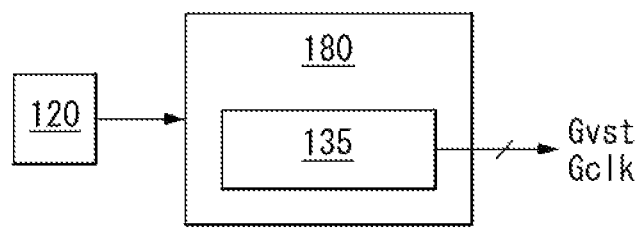
FIG. 6 is a diagram showing a second example of a structure of a device related to a gate in panel type scan driver.

FIG. 5 is a diagram showing a first example of a structure of a device related to a gate in panel type scan driver, FIG. 6 is a diagram showing a second example of a structure of a device related to a gate in panel type scan driver, and FIG. 7 is a diagram showing an example of arrangement of a gate in panel type scan driver.

As shown in FIGS. 5 to 7, gate in panel type scan drivers 131 and 135 may include a shift register circuit unit 131 (a scan signal generator) and a level shifter 135 (a clock signal and a voltage generator).

The level shifter 135 may generate and output a plurality of clock signals Gclk and a start signal Gvst based on signals output from the timing controller 120. The plurality of clock signals Gclk may be generated and output in the form of K phases (K is an integer equal to or greater than 2) such as 2 phases, 4 phases, or 8 phases. The plurality of clock signals Gclk and the start signal Gvst may be output through signals pads of the level shifter 135 and may be transferred to the shift register circuit unit 131 through signal lines connected to the signal pads.

The shift register circuit unit 131 may be operated based on signals Gclk and Gvst output from the level shifter 135 and may output scan signals Scan[1] to Scan[m] for turning on or off a transistor formed on the display panel. The shift register circuit unit 131 may be formed in the form of a thin film on the display panel in a gate in panel type. Thus, a device formed on the display panel of the scan driver 130 may be the shift register circuit unit 131.

Figure 7A:
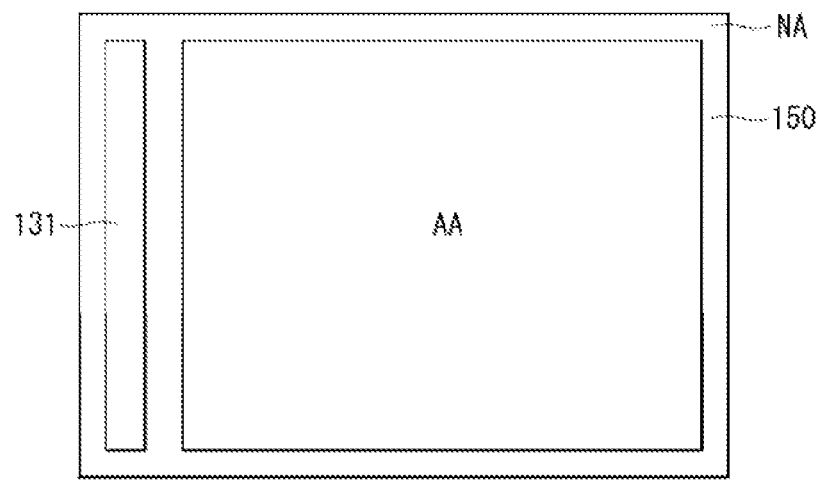
FIGS. 7A and 7B are diagrams showing examples of arrangement of a gate in panel type scan driver.
Figure 7B:
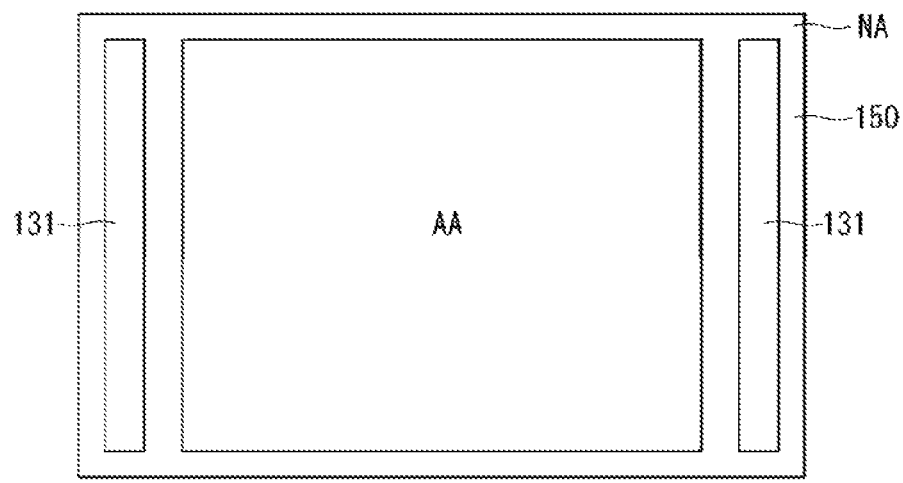

The shift register circuit unit 131 may be disposed in a non-display area NA of the display panel 150. As shown in FIG. 7A, the shift register circuit unit 131 may be disposed in the non-display area NA of a left side (a right side) of the display panel 150. As shown in FIG. 7B, the shift register circuit unit 131 may be disposed in the non-display area NA of both the right and left sides of the display panel 150. However, the structure and arrangement of the scan drivers 131 and 135 are not limited thereto.

Differently from the shift register circuit unit 131, the level shifter 135 may be formed in the form of an IC. As shown in FIG. 5, the level shifter 135 may be configured in the form of a separate IC, or as shown in FIG. 6, the level shifter 135 may be included inside the power supply 180 or another device.

As such, the shift register circuit unit 131 may output the output scan signals Scan[1] to Scan[m] based on the plurality of clock signals Gclk, the start signal Gvst, and the like output from the level shifter 135.

FIG. 8 is a diagram showing a first example of a display panel, and FIG. 9 is a diagram showing a second example of a display panel.

Figure 8A:
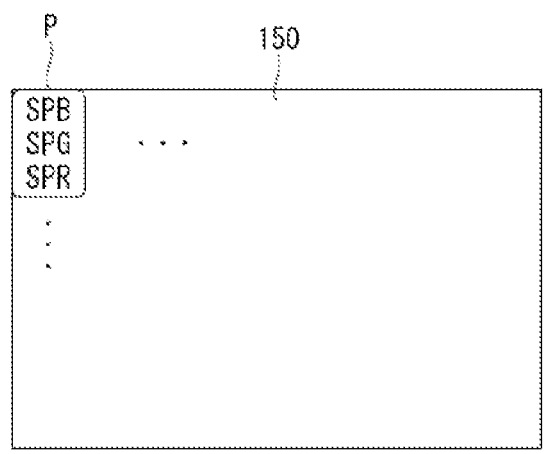
FIGS. 8A and 8B are diagrams showing first examples of a display panel.
Figure 8B:
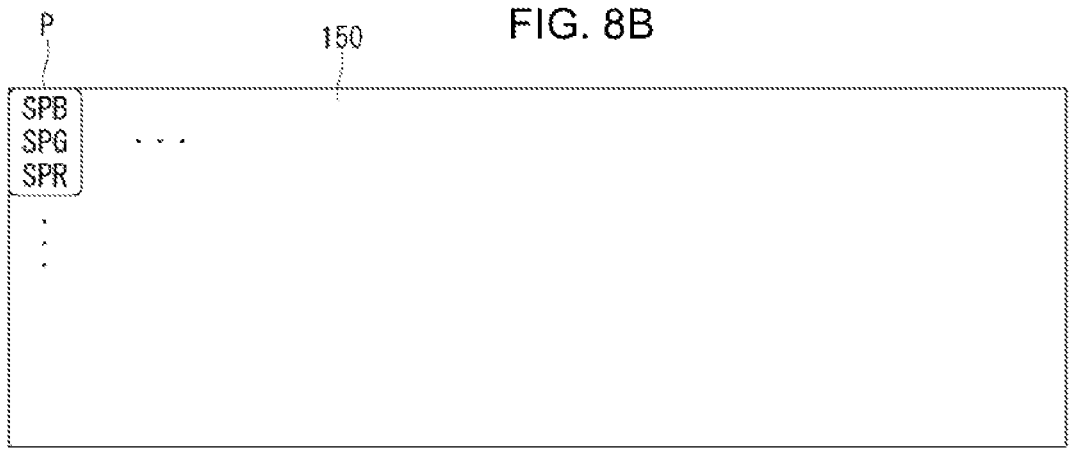
Figure 9A:
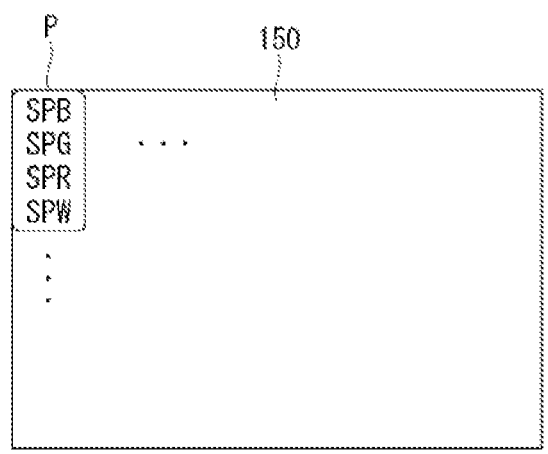
FIGS. 9A and 9B are diagrams showing second examples of a display panel.
Figure 9B:
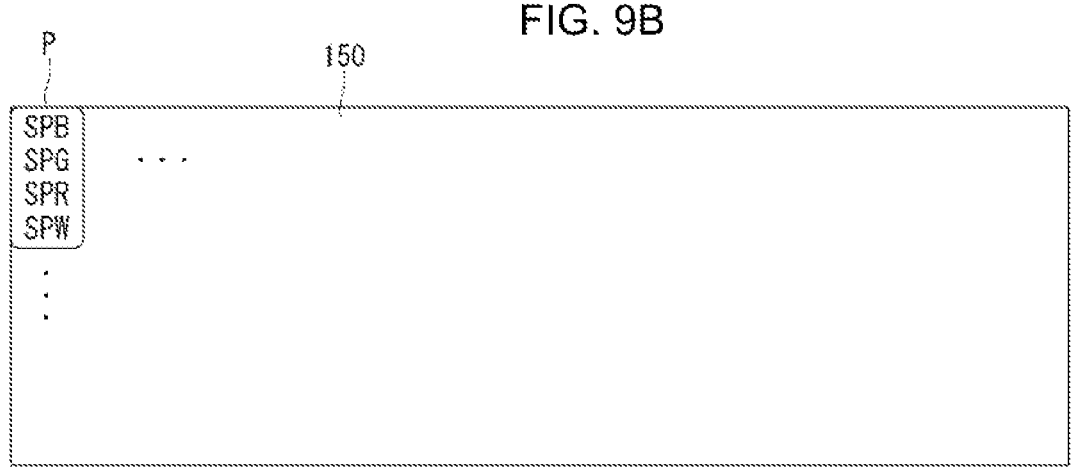

As shown in FIGS. 8A and 9A, the display panel 150 may be configured in the form that is generally and widely used, for example, a rectangular shape with a longer horizontal length than a vertical length. As shown in FIGS. 8B and 9B, the display panel 150 may be configured in the form of a rectangular shape with a longer horizontal length twice or greater than a vertical length, such as an automotive electronic module or an advertisement panel.

As shown in FIGS. 8A and 8B, the display panel 150 may include a pixel P including a blue sub-pixel SPB, a green sub-pixel SPG, and a red sub-pixel SPR. As shown in FIGS. 9A and 9B, the display panel 150 may include a pixel P including the blue sub-pixel SPB, the green sub-pixel SPG, the red sub-pixel SPR, and a white sub-pixel SPW.

However, the structure of the display panel 150 illustrated and described in FIGS. 8 and 9 are merely exemplary and the present disclosure is not limited thereto. FIGS. 8 and 9 illustrates an example in which the pixel P is disposed in a vertical direction but not in a horizontal direction, but this is merely exemplary and the present disclosure is not limited thereto. However, in the following description, an example in which the pixel P is disposed in a vertical direction will be described.

Figure 10:
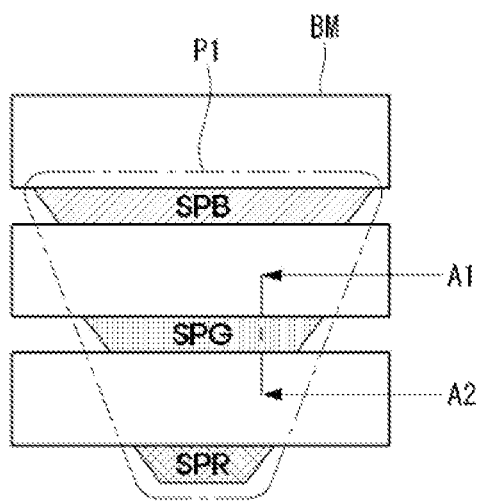
FIG. 10 is a plan view illustrating a portion of a display panel according to a first aspect of the present disclosure.
Figure 11:
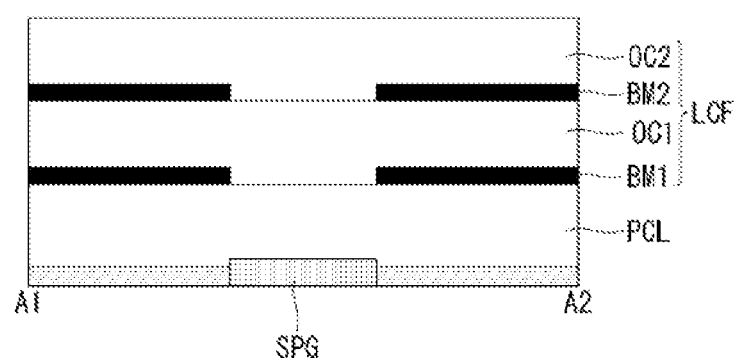
FIG. 11 is a schematic cross-sectional view illustrating a portion of a region taken along A1-A2 shown in FIG. 10 according to the first aspect of the present disclosure.
Figure 12:
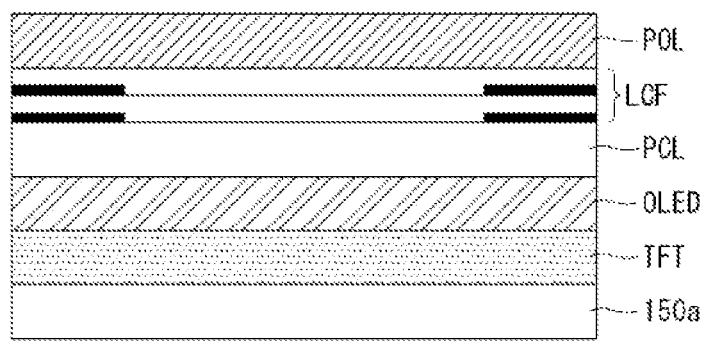
FIG. 12 is a cross-sectional view illustrating a display panel having a pixel shown in FIG. 10 according to the first aspect of the present disclosure.

FIG. 10 is a plan view illustrating a portion of a display panel according to a first aspect of the present disclosure, FIG. 11 is a schematic cross-sectional view illustrating a portion of a region taken along A1-A2 shown in FIG. 10 according to the first aspect of the present disclosure, and FIG. 12 is a cross-sectional view illustrating a display panel having a pixel shown in FIG. 10 according to the first aspect of the present disclosure.

As shown in FIG. 10, a pixel P1 embodied in the display panel according to the first aspect may include the blue sub-pixel SPB, the green sub-pixel SPG, and the red sub-pixel SPR that are arranged in a vertical direction. Black matrices BM may be positioned between the blue sub-pixel SPB, the green sub-pixel SPG, and the red sub-pixel SPR.

The black matrix BM may be disposed a long way in a horizontal direction (or a longitudinal direction of a substrate) of the display panel to define a non-emissive area between sub-pixels. That is, the black matrix BM may be disposed in a stripe form (or a horizontal band form). In the black matrix BM, a shield portion for shielding the non-emissive area of sub-pixels may have a wider width than an opening portion for exposing an emissive area of the sub-pixels.

As shown in FIG. 11, based on the green sub-pixel SPG, a passivation layer PCL may be positioned on sub-pixels. A first black matrix layer BM1 may be positioned on the passivation layer PCL. A first cover layer OC1 may be positioned on the first black matrix layer BM1. A second black matrix layer BM2 may be positioned on the first cover layer OC1. A second cover layer OC2 may be positioned on the second black matrix layer BM2.

The first black matrix layer BM1, the first cover layer OC1, the second black matrix layer BM2, and the second cover layer OC2 that are positioned on the passivation layer PCL may control emitted light that is generated or emitted from a sub-pixel. Thus, the first black matrix layer BM1, the first cover layer OC1, the second black matrix layer BM2, and the second cover layer OC2 may be referred to as an emitted light control layer LCF.

The first black matrix layer BM1 and the second black matrix layer BM2 may be disposed with the same width and length in a display area of the display panel. However, due to the characteristics (processing characteristics) of the structure of the display panel, the width or length of the display panel may also be changed in a partial portion of a non-display area that deviates from a display area.

When the emitted light control layer LCF is used in, particularly, an automotive electronic module, the emitted light control layer LCF may be disposed on the passivation layer PCL to overcome a problem in that an image displayed on a screen is reflected on a front glass window of a vehicle. That is, the emitted light control layer LCF may control emitted light, but may basically control an up and down viewing angle of the display panel.

To this end, the emitted light control layer LCF may include the first black matrix layer BM1 and the second black matrix layer BM2 that are divided into at least two layers. In addition, as seen from a sectional view for exposing an emissive area of the green sub-pixel SPG, the emitted light control layer LCF may be disposed in a horizontal direction to divide the non-emissive area of sub-pixels that are adjacent upward and downward and to expose the emissive area. Hereinafter, a sectional view of the structure of the display panel including the emitted light control layer LCF will now be described.

As shown in FIG. 12, a transistor unit TFT may be positioned on a lower substrate 150a. The transistor unit TFT may include a switching transistor, a driving transistor, a storage transistor, or the like. An organic light emitting diode OLED that emits red, green, or blue light may be positioned on the transistor unit TFT. The organic light emitting diode OLED may include a lower electrode connected to a source or a drain electrode of the transistor unit TFT, and an upper electrode connected to an emissive layer for emitting light and a second driving voltage line.

The passivation layer PCL may be positioned on the organic light emitting diode OLED. The passivation layer PCL may be selected a material with high transmissivity. The emitted light control layer LCF may be positioned on the passivation layer PCL. A structure of the emitted light control layer LCF will be described in detail with reference to FIG. 11. A polarizer plate POL may be positioned on the emitted light control layer LCF. The polarizer plate POL may be formed in a film type or a coating type.

The present disclosure may overcome a problem in that an image displayed on a screen is reflected on a unwanted area (e.g., a front glass window of a vehicle), a problem in terms of degraded image quality, a problem in terms of degraded brightness, and a problem in terms of increase in the thickness of a product, and may also provide an optimum image.

Hereinafter, a pixel rendering structure for enhancing performance (enhancement in lifespan of an OLED and prevention of reduction in brightness) of a display panel as well as the emitted light control layer LCF according to the present disclosure will be described.

Figure 13:
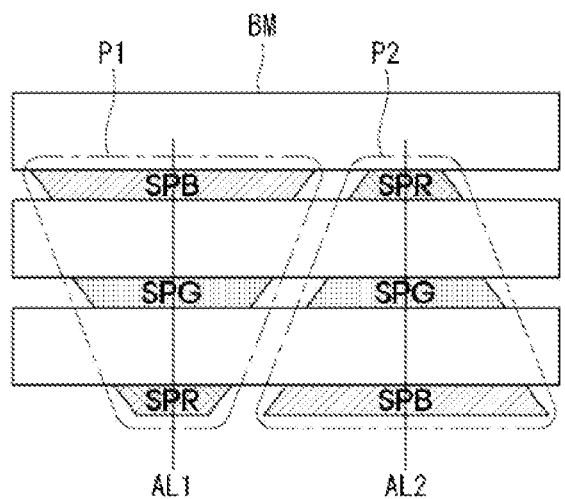
FIG. 13 is a plan view illustrating a portion of a display panel according to a second aspect of the present disclosure.
Figure 14:
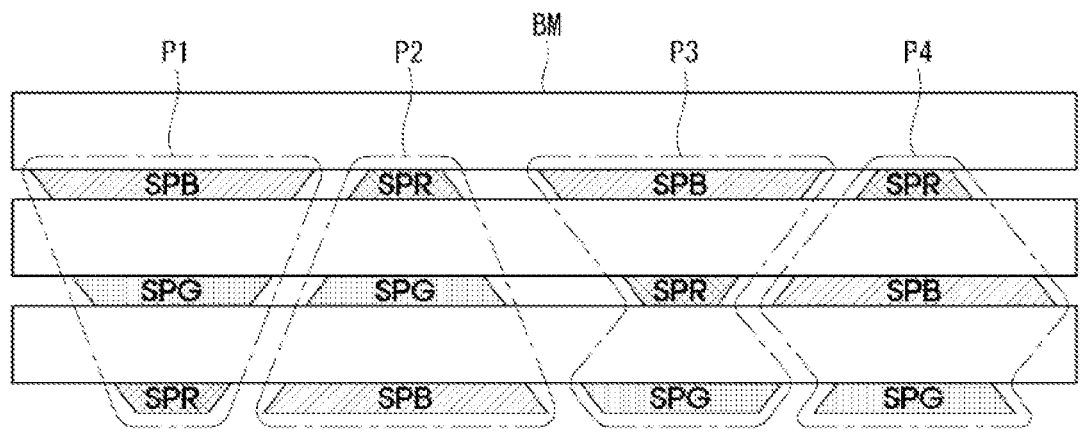
FIG. 14 is a plan view illustrating arrangement of total four pixels according to the second aspect.

FIG. 13 is a plan view illustrating a portion of a display panel according to a second aspect of the present disclosure, and FIG. 14 is a plan view illustrating arrangement of total four pixels according to the second aspect.

As shown in FIG. 13, pixels P1 and P2 embodied in the display panel according to the second aspect may include the blue sub-pixel SPB, the green sub-pixel SPG, and the red sub-pixel SPR. The black matrix BM may be positioned between every two of the blue sub-pixel SPB, the green sub-pixel SPG, and the red sub-pixel SPR. The black matrix BM may be disposed a long way in a horizontal direction of the display panel to define the non-emissive area between sub-pixels.

Viewed from the above, the blue sub-pixel SPB, the green sub-pixel SPG, and the red sub-pixel SPR included in the first pixel P1 and the second pixel P2 may each have a trapezoid shape with a longer horizontal length than a vertical length. The sub-pixels included in the first pixel P1 and the second pixel P2 may be arranged in such that a central area is aligned in a first reference area AL1 of the first pixel P1 and a second reference area AL2 of the second pixel P2. That is, the sub-pixels included in the first pixel P1 and the second pixel P2 may be aligned based on the central area of a reference sub-pixel.

The sub-pixels included in the first pixel P1 and the second pixel P2 may be arranged to reduce the sizes (emissive areas) of the blue sub-pixel SPB, the green sub-pixel SPG, and the red sub-pixel SPR in the stated order. As a result, the trapezoid shape may be achieved by summing the sub-pixels included in the first pixel P1 and the second pixel P2 in a vertical direction. Thus, one sub-pixel and one pixel as an assembly of sub-pixels may also have a trapezoid shape.

The first pixel P1 may be disposed in such a way that the blue sub-pixel SPB, the green sub-pixel SPG, and the red sub-pixel SPR are arranged in the stated order to a lower end from an upper end, and the second pixel P2 adjacent to the first pixel P1 may be disposed in such a way that the red sub-pixel SPR, the green sub-pixel SPG, and the blue sub-pixel SPB are arranged in the stated order to the lower end from the upper end. That is, the arranged order of the sub-pixels included in the first pixel P1 and the arranged order of the sub-pixels included in the second pixel P2 may be opposite. Thus, when the emissive area of the first pixel P1 is taken, a lower region is narrower than an upper region, and when the emissive area of the second pixel P2 is taken, an upper region is narrower than a lower region.

As shown in FIG. 14, the first and second pixels P1 and P2 may be arranged as described above with reference to FIG. 13. However, third and fourth pixels P3 and P4 adjacent thereto may have different arrangement from the first and second pixels P1 and P2.

For example, the third pixel P3 may be disposed in such a way that the blue sub-pixel SPB, the red sub-pixel SPR, and the green sub-pixel SPG are arranged in the stated order to a lower end from an upper end, but the fourth pixel P4 adjacent to the third pixel P3 may be disposed in such a way that the red sub-pixel SPR, the blue sub-pixel SPB, and the green sub-pixel SPG are arranged in the stated order to a lower end from an upper end. Thus, one sub-pixel may have a trapezoid shape but one pixel as an assembly of sub-pixels may have a concave or convex central portion compared with an upper end or a lower end.

However, as seen from the arrangements of FIGS. 13 and 14, viewed from a sectional view, every two pixels P1 and P2 or P3 and P4, the blue sub-pixel SPB and the red sub-pixel SPR or the red sub-pixel SPR and the blue sub-pixel SPB may be arranged to configure a first group, and two green sub-pixels SPG that emit light with the same color may be arranged to configure a second group. That is, the first group may be defined as two sub-pixels that emit light with different colors on the same line, and the second group may be defined as two sub-pixels that emit light with the same color on the same line.

Figure 15:
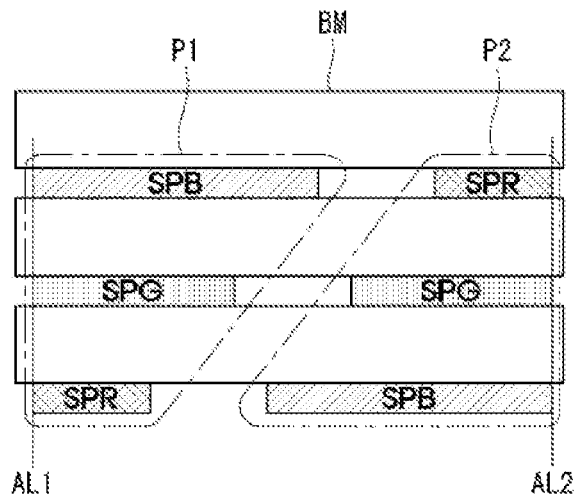
FIG. 15 is a plan view illustrating a portion of a display panel according to a third aspect of the present disclosure.
Figure 16:
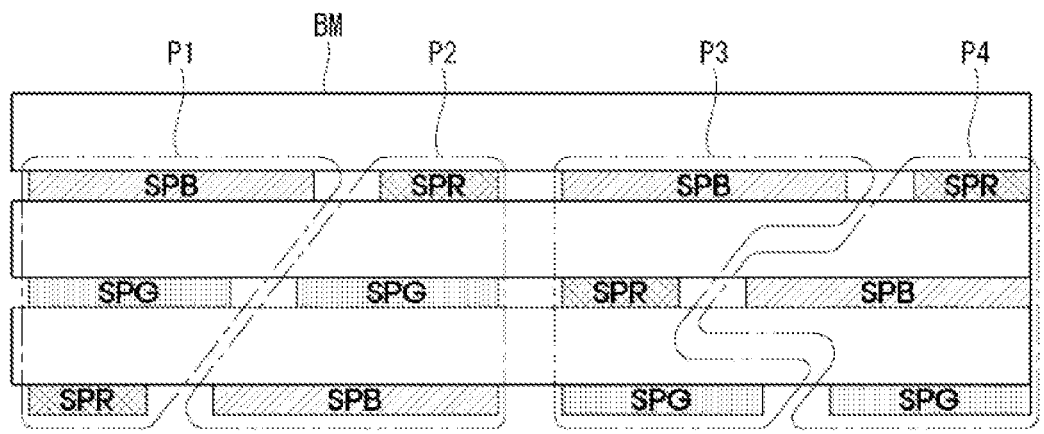
FIG. 16 is a plan view illustrating arrangement of total four pixels according to the third aspect.

FIG. 15 is a plan view illustrating a portion of a display panel according to a third aspect of the present disclosure, and FIG. 16 is a plan view illustrating arrangement of total four pixels according to the third aspect.

As shown in FIG. 15, the pixels P1 and P2 embodied in the display panel according to the third aspect may include the blue sub-pixel SPB, the green sub-pixel SPG, and the red sub-pixel SPR. The black matrix BM may be positioned between every two of the blue sub-pixel SPB, the green sub-pixel SPG, and the red sub-pixel SPR. The black matrix BM may be disposed in a long way in a horizontal direction of the display panel to define the non-emissive area between sub-pixels.

The blue sub-pixel SPB, the green sub-pixel SPG, and the red sub-pixel SPR included in the first pixel P1 and the second pixel P2 may each have a rectangular shape with a longer longitudinal length than a vertical length viewed from the above. Sub-pixels included in the first pixel P1 may be arranged to align a left side surface of the first pixel P1 with respect to the first reference area AL1, and sub-pixels included in the second pixel P2 may be arranged to align a right side surface of the second pixel P2 with respect to the second reference area AL2. That is, sub-pixels included in the first pixel P1 and the second pixel P2 may be aligned based on a left side surface or a right side surface of a reference sub-pixel.

The sub-pixels included in the first pixel P1 and the second pixel P2 may be arranged to reduce the sizes of the blue sub-pixel SPB, the green sub-pixel SPG, and the red sub-pixel SPR in the stated order. As a result, a stepped shape may be achieved by summing the sub-pixels included in the first pixel P1 and the second pixel P2 in a vertical direction. Thus, one sub-pixel may have a rectangular shape but one pixel as an assembly of sub-pixels may have a stepped shape.

The first pixel P1 may be disposed in such a way that the blue sub-pixel SPB, the green sub-pixel SPG, and the red sub-pixel SPR are arranged in the stated order to a lower end from an upper end, but the second pixel P2 adjacent to the first pixel P1 may be disposed in such a way that the red sub-pixel SPR, the green sub-pixel SPG, and the blue sub-pixel SPB are arranged in the stated order to a lower end from an upper end. That is, the arranged order of sub-pixels included in the first pixel P1 and the arranged order of sub-pixels included in the second pixel P2 may be opposite. Thus, when an emissive area of the first pixel P1 is taken, a lower region is narrower than an upper region, and when an emissive area of the second pixel P2 is taken, an upper region is narrower than a lower region.

As shown in FIG. 16, the first and second pixels P1 and P2 may be arranged as described above with reference to FIG. 15. However, the third and fourth pixels P3 and P4 adjacent to the first and second pixels P1 and P2 may have different arrangement from the first and second pixels P1 and P2.

For example, the third pixel P3 may be disposed in such a way that the blue sub-pixel SPB, the red sub-pixel SPR, and the green sub-pixel SPG are arranged in the stated order to a lower end from an upper end, but the fourth pixel P4 adjacent to the third pixel P3 may be disposed in such a way that the red sub-pixel SPR, the blue sub-pixel SPB, and the green sub-pixel SPG are arranged in the stated order to a lower end from an upper end. Thus, one sub-pixel may have a rectangular shape but one pixel as an assembly of sub-pixels may have a concave or convex central portion compared with an upper end or a lower end.

However, as seen from the arrangements of FIGS. 15 and 15, viewed from a sectional view, every two pixels P1 and P2 or P3 and P4, the blue sub-pixel SPB and the red sub-pixel SPR or the red sub-pixel SPR and the blue sub-pixel SPB may be arranged to configure a first group, and two green sub-pixels SPG that emit light with the same color may be arranged to configure a second group.

Figure 17:
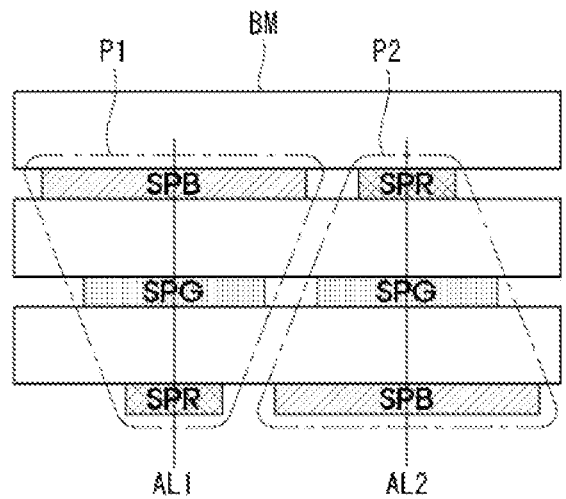
FIG. 17 is a plan view illustrating a portion of a display panel according to a fourth aspect of the present disclosure.
Figure 18:
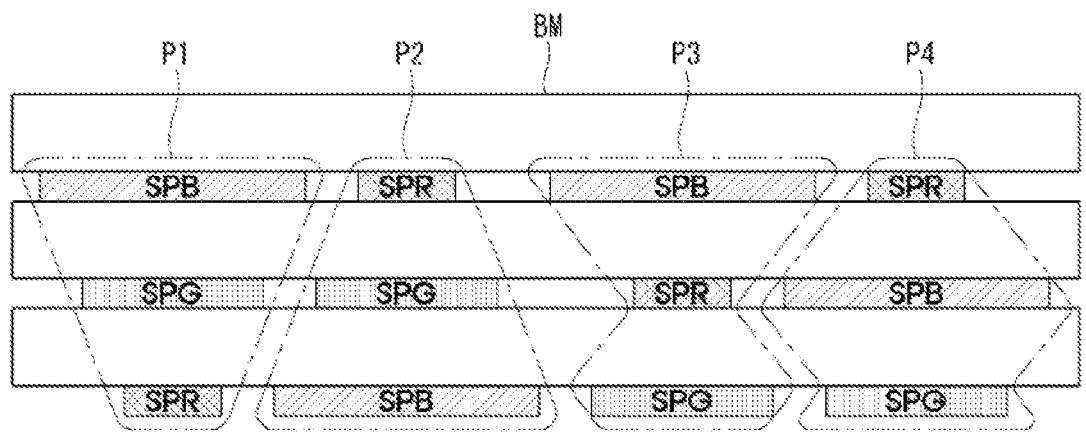
FIG. 18 is a plan view illustrating arrangement of total four pixels according to the fourth aspect.

FIG. 17 is a plan view illustrating a portion of a display panel according to a fourth aspect of the present disclosure, and FIG. 18 is a plan view illustrating arrangement of total four pixels according to the fourth aspect.

As shown in FIG. 17, the pixels P1 and P2 embodied in the display panel according to the fourth aspect may include the blue sub-pixel SPB, the green sub-pixel SPG, and the red sub-pixel SPR. The black matrix BM may be positioned between every two of the blue sub-pixel SPB, the green sub-pixel SPG, and the red sub-pixel SPR. The black matrix BM may be arranged in a long way in a horizontal direction of the display panel to define the non-emissive area between sub-pixels.

Viewed from the above, the blue sub-pixel SPB, the green sub-pixel SPG, and the red sub-pixel SPR included in the first pixel P1 and the second pixel P2 may each have a rectangular shape with a longer horizontal length than a vertical length. The sub-pixels included in first pixel P1 and the second pixel P2 may be arranged to align a central area of the first pixel P1 with respect to the first reference area AL1 and a central area of the second pixel P2 with respect to the second reference area AL2.

The sub-pixels included in the first pixel P1 and the second pixel P2 may be arranged to reduce the sizes of the blue sub-pixel SPB, the green sub-pixel SPG, and the red sub-pixel SPR in the stated order. As a result, a trapezoid shape may be achieved by summing sub-pixels included in the first pixel P1 and the second pixel P2 in a vertical direction. Thus, one sub-pixel may have a rectangular shape, but one pixel as an assembly of sub-pixels may have a trapezoid shape.

The first pixel P1 may be disposed in such a way that the blue sub-pixel SPB, the green sub-pixel SPG, and the red sub-pixel SPR are arranged in the stated order to a lower end from an upper end, but the second pixel P2 adjacent to the first pixel P1 may be disposed in such a way that the red sub-pixel SPR, the green sub-pixel SPG, and the blue sub-pixel SPB are arranged in the stated order to a lower end from an upper end. That is, the arranged order of sub-pixels included in the first pixel P1 and the arranged order of sub-pixels included in the second pixel P2 may be opposite. Thus, when an emissive area of the first pixel P1 is taken, a lower region may be narrower than an upper region, and when an emissive area of the second pixel P2 is taken, an upper region may be narrower than a lower region.

As shown in FIG. 18, the first and second pixels P1 and P2 may be arranged as described above with reference to FIG. 17. However, the third and fourth pixels P3 and P4 adjacent to the first and second pixels P1 and P2 may have different arrangement from the first and second pixels P1 and P2.

For example, the third pixel P3 may be disposed in such a way that the blue sub-pixel SPB, the red sub-pixel SPR, and the green sub-pixel SPG are arranged in the stated order to a lower end from an upper end, but the fourth pixel P4 adjacent to the third pixel P3 may be disposed in such a way that the red sub-pixel SPR, the blue sub-pixel SPB, and the green sub-pixel SPG are arranged in the stated order to a lower end from an upper end. Thus, one sub-pixel has a rectangular shape, but one pixel as an assembly of sub-pixels may have a concave or convex central portion compared with an upper end or a lower end.

However, as seen from the arrangements of FIGS. 17 and 18, viewed from a sectional view, every two pixels P1 and P2 or P3 and P4, the blue sub-pixel SPB and the red sub-pixel SPR or the red sub-pixel SPR and the blue sub-pixel SPB may configure a first group, and two green sub-pixels SPG that emit light with the same color may be arranged to configure a second group.

Figure 19:
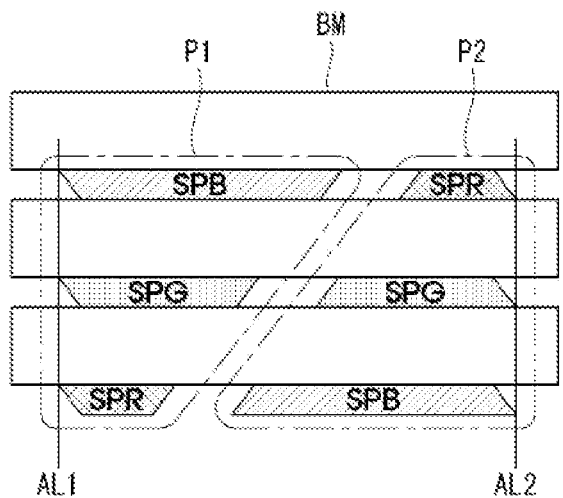
FIG. 19 is a plan view illustrating a portion of a display panel according to a fifth aspect of the present disclosure.
Figure 20:
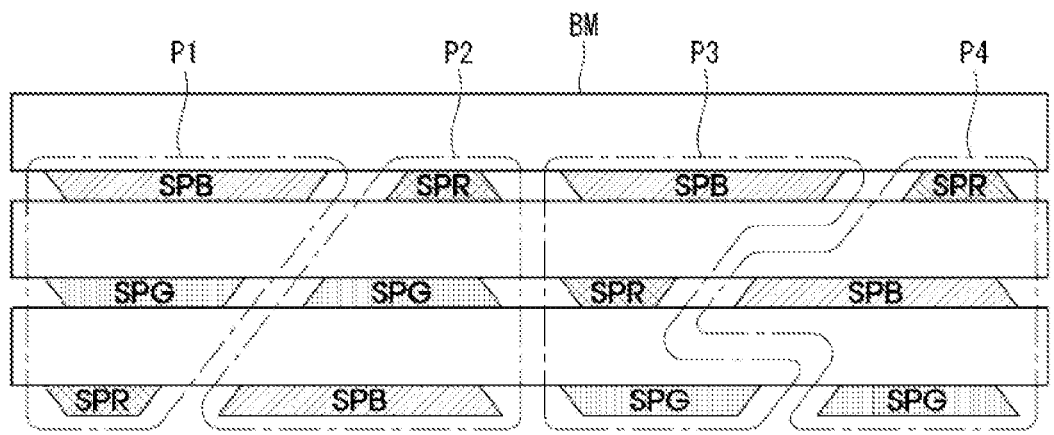
FIG. 20 is a plan view illustrating arrangement of total four pixels according to the fifth aspect of the present disclosure.

FIG. 19 is a plan view illustrating a portion of a display panel according to a fifth aspect of the present disclosure, and FIG. 20 is a plan view illustrating arrangement of total four pixels according to the fifth aspect of the present disclosure.

As shown in FIG. 19, the pixels P1 and P2 embodied in the display panel according to the fifth aspect may include the blue sub-pixel SPB, the green sub-pixel SPG, and the red sub-pixel SPR. The black matrix BM may be positioned between every two of the blue sub-pixel SPB, the green sub-pixel SPG, and the red sub-pixel SPR. The black matrix BM may be disposed a long way in a horizontal direction of the display panel to define the non-emissive area between sub-pixels.

Viewed from the above, the blue sub-pixel SPB, the green sub-pixel SPG, and the red sub-pixel SPR included in the first pixel P1 and the second pixel P2 may have a trapezoid shape with a longer horizontal length than a vertical length. The sub-pixels included in the first pixel P1 may be arranged to align a left end of the first pixel P1 with respect to the first reference area AL1 and sub-pixels included in the second pixel P2 may be arranged to align a right end of the second pixel P2 with respect to the second reference area AL2. That is, sub-pixels included in the first pixel P1 and the second pixel P2 may be aligned based on one end of a reference sub-pixel.

The sub-pixels included in the first pixel P1 and the second pixel P2 may be arranged to reduce the areas of the blue sub-pixel SPB, the green sub-pixel SPG, and the red sub-pixel SPR in the stated order. As a result, a stepped shape may be achieved by summing the sub-pixels included in the first pixel P1 and the second pixel P2 in a vertical direction. Thus, one sub-pixel may have a trapezoid shape but one pixel as an assembly of sub-pixels may have a stepped shape.

The first pixel P1 may be disposed in such a way that the blue sub-pixel SPB, the green sub-pixel SPG, and the red sub-pixel SPR are arranged in the stated order to a lower end from an upper end, but the second pixel P2 adjacent to the first pixel P1 may be disposed in such a way that the red sub-pixel SPR, the green sub-pixel SPG, and the blue sub-pixel SPB are arranged in the stated order to a lower end from an upper end. That is, the arranged order of sub-pixels included in the first pixel P1 and the arranged order of sub-pixels included in the second pixel P2 may be opposite. Thus, when the emissive area of the first pixel P1 is taken, a lower region is narrower than an upper region, and when the emissive area of the second pixel P2 is taken, an upper region is narrower than a lower region.

As shown in FIG. 20, the first and second pixels P1 and P2 may be arranged as described above with reference to FIG. 19. However, the third and fourth pixels P3 and P4 adjacent thereto may have different arrangement from the first and second pixels P1 and P2.

For example, the third pixel P3 may be disposed in such a way that the blue sub-pixel SPB, the red sub-pixel SPR, and the green sub-pixel SPG in the stated order to a lower end from an upper end, but the fourth pixel P4 adjacent to the third pixel P3 may be disposed in such a way that the red sub-pixel SPR, the blue sub-pixel SPB, and the green sub-pixel SPG are arranged in the stated order to a lower end from an upper end. Thus, one sub-pixel may have a trapezoid shape but one pixel as an assembly of sub-pixels may have a concave or convex central portion compared with an upper end or a lower end.

However, as seen from the arrangements of FIGS. 19 and 20, viewed from a sectional view, every two pixels P1 and P2 or P3 and P4, the blue sub-pixel SPB and the red sub-pixel SPR or the red sub-pixel SPR and the blue sub-pixel SPB may be arranged to configure a first group, and two green sub-pixels SPG that emit light with the same color may be arranged to configure a second group.

According to the first to fifth aspects of the present disclosure, an example in which an emissive layer included in a sub-pixel autonomously emits red, green, and blue light is described. However, when the emissive layer included in the sub-pixel does not autonomously emit red, green, and blue light, the following structure may be used.

Figure 21:
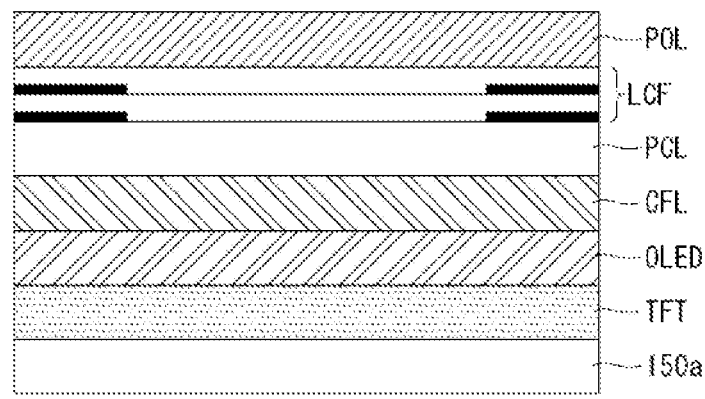
FIG. 21 is a cross-sectional view of a display panel having a pixel shown in FIG. 10 according to a sixth aspect of the present disclosure.
Figure 22:
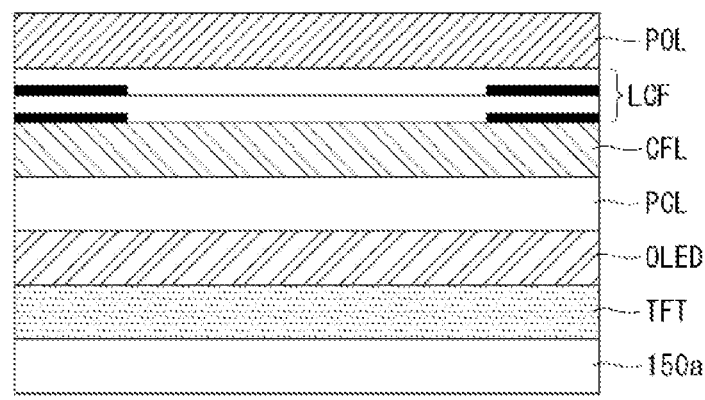
FIG. 22 is a cross-sectional view of a display panel having a pixel shown in FIG. 10 according to a seventh aspect of the present disclosure.

FIG. 21 is a cross-sectional view of a display panel having a pixel shown in FIG. 10 according to a sixth aspect of the present disclosure, and FIG. 22 is a cross-sectional view of a display panel having a pixel shown in FIG. 10 according to a seventh aspect of the present disclosure.

As shown in FIG. 21, the transistor unit TFT may be positioned on the lower substrate 150a. The transistor unit TFT may include a switching transistor, a driving transistor, and a storage transistor. The organic light emitting diode OLED that emits white light may be positioned on the transistor unit TFT. The organic light emitting diode OLED may include a lower electrode connected to a source or drain electrode of the transistor unit TFT, and an upper electrode connected to an emissive layer for emitting light and a second driving voltage line.

A color filter layer CFL may be positioned on the organic light emitting diode OLED. The color filter layer CFL may convert white light emitted from the organic light emitting diode OLED into red, green, or blue light. The passivation layer PCL may be positioned on the color filter layer CFL. The passivation layer PCL may be selected as a material with high transmissivity. The emitted light control layer LCF may be positioned on the passivation layer PCL. A detailed structure of the emitted light control layer LCF is understood with reference to FIG. 11. The polarizer plate POL may be positioned on the emitted light control layer LCF. The polarizer plate POL may be formed in a film type or a coating type.

As shown in FIG. 22, the transistor unit TFT may be positioned on the lower substrate 150a. The transistor unit TFT may include a switching transistor, a driving transistor, and a storage transistor. The organic light emitting diode OLED that emits white light may be positioned on the transistor unit TFT. The organic light emitting diode OLED may include a lower electrode connected to a source or drain electrode of the transistor unit TFT, and an upper electrode connected to an emissive layer for emitting light and a second driving voltage line.

The passivation layer PCL may be positioned on the organic light emitting diode OLED. The passivation layer PCL may be selected as a material with high transmissivity. The color filter layer CFL may be positioned on the passivation layer PCL. The color filter layer CFL may convert white light emitted from the organic light emitting diode OLED into red, green, or blue light. The emitted light control layer LCF may be positioned on the color filter layer CFL. A detailed structure of the emitted light control layer LCF will be understood with reference to FIG. 11. The polarizer plate POL may be positioned on the emitted light control layer LCF. The polarizer plate POL may be formed in a film type or a coating type.

Figure 23:
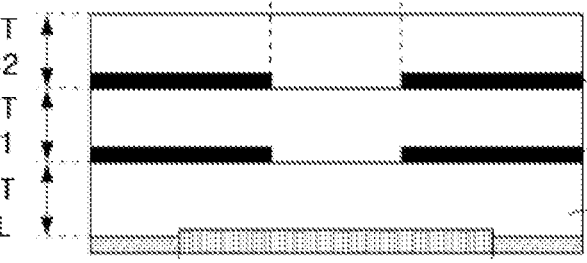
FIG. 23 is a diagram for explaining an overlap and non-overlap relationship between an emitted light control layer and a sub-pixel.
Figure 24:
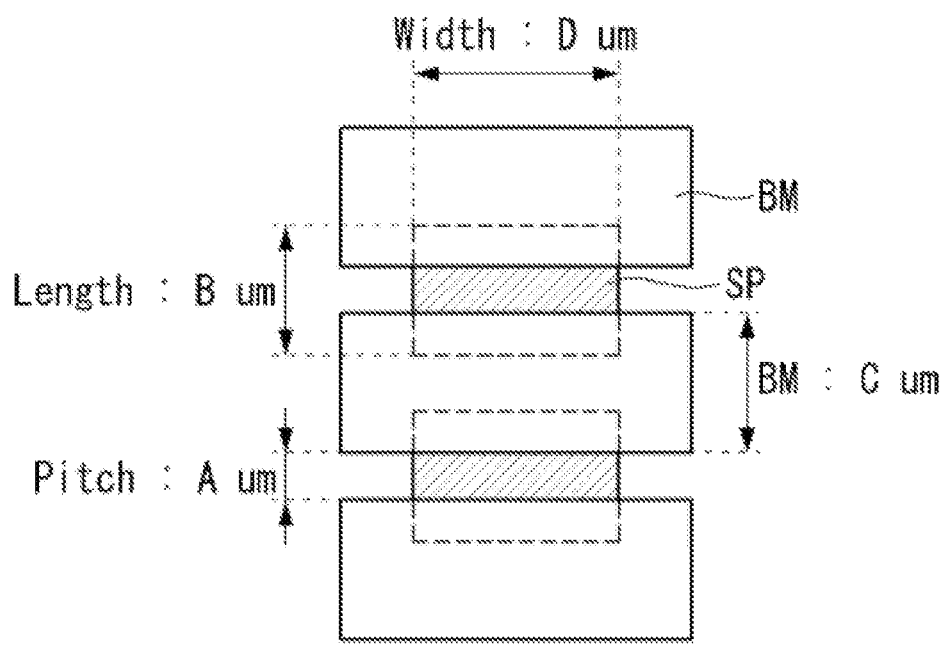
FIGS. 24 and 25 are diagrams showing a simulation result obtained from an experiment of a change in the transmissivity and viewing angle depending on a structure of the emitted light control layer and the sub-pixel.
Figure 25:
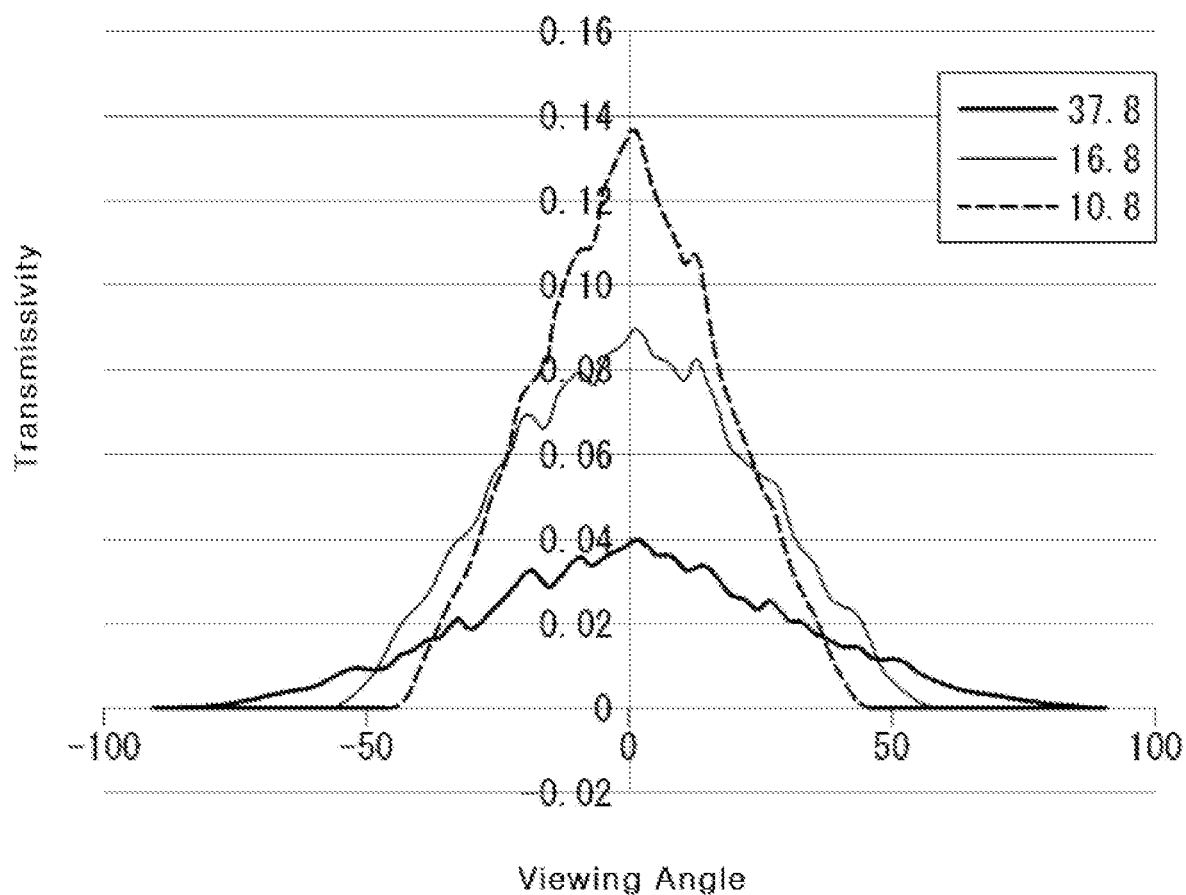

FIG. 23 is a diagram for explaining an overlap and non-overlap relationship between an emitted light control layer and a sub-pixel, and FIGS. 24 and 25 are diagrams showing a simulation result obtained from an experiment of a change in the transmissivity and viewing angle depending on a structure of the emitted light control layer and the sub-pixel.

As shown in FIG. 23, first and second black matrix layers BM1 and BM2 included in the emitted light control layer LCF may have a region that overlaps with the sub-pixel or extremely partially overlaps with the sub-pixel, or may not overlap with the sub-pixel.

As described above, the emitted light control layer LCF may have a function of controlling an up and down viewing angle of the display panel. In order to control the up and down viewing angle of the display panel using the emitted light control layer LCF, there is a need for a design related to a sub-pixel provided on the display panel.

For example, the height of the first and second cover layers OC1 and OC2 included in the emitted light control layer LCF may be defined in consideration of the shape, emissive characteristics, and an emissive region (emissive area) of the sub-pixel provided on the display panel. In addition, the height of the passivation layer PCL may be changed depending on the structure of the sub-pixel, and thus, the height of the first and second cover layers OC1 and OC2 included in the emitted light control layer LCF may be defined in further consideration of the structure of the sub-pixel.

However, in terms of a function for controlling an up and down viewing angle of the display panel by the emitted light control layer LCF, a pitch between black matrix layers (a pitch between BMs) that is a pitch between the first and second black matrix layers BM1 and BM2 and a vertical length of a sub-pixel (the width of the SP) may also be considered. The reason will be understood with reference to the following simulation result of FIGS. 24 and 25.

As shown in FIGS. 24 and 25, according to the present disclosure, a simulation for centrally considering a function of controlling an up and down viewing angle of the display panel is performed. In the simulation, while a number such as a vertical length (BM) of the black matrix BM included in the emitted light control layer LCF, a pitch between the black matrices BM, and a vertical length (LENGTH) and a horizontal length (WIDTH) of the sub-pixel SP may be changed, a change in the transmissivity and viewing angle is observed depending on the changed number.

According to the simulation result, when a vertical length (BM) of the black matrix BM is fixed to C μm, a pitch between the black matrix BM is fixed to A μm, and a horizontal length (WIDTH) of the sub-pixel SP is fixed to B μm, only B μm that is a vertical length (LENGTH) of the sub-pixel SP is changed.

As seen from the simulation result, when the vertical length (LENGTH) of the sub-pixel SP is 37.8 μm, the up and down viewing angle of the display panel is changed to 63°, when the vertical length (LENGTH) of the sub-pixel SP is 16.8 μm, the up and down viewing angle of the display panel is changed to 48°, and when the vertical length (LENGTH) of the sub-pixel SP is 10.8 μm, the up and down viewing angle of the display panel is changed to 38°.

Accordingly, as seen from the simulation result, in the display device according to the present disclosure, the up and down viewing angle of the display panel is changed by changing the structure of an emitted light control layer and a sub-pixel depending on an application target. In addition, as seen from the simulation result, in the display device according to the present disclosure, the viewing angle of the display panel may be changed without reduction in a front viewing angle or brightness (there is no structure that hinders emitted light of a pixel).

Figure 26:
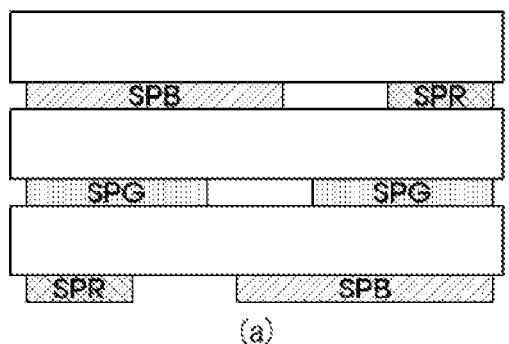
FIG. 26 is a diagram showing an example of a portion of a display panel according to the present disclosure.
Figure 26:
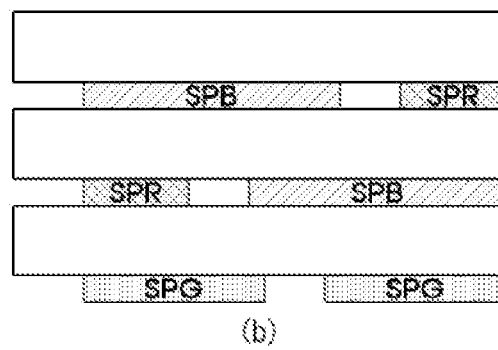
Figure 26:
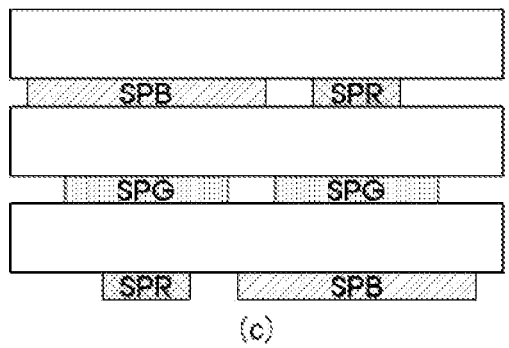
Figure 26:
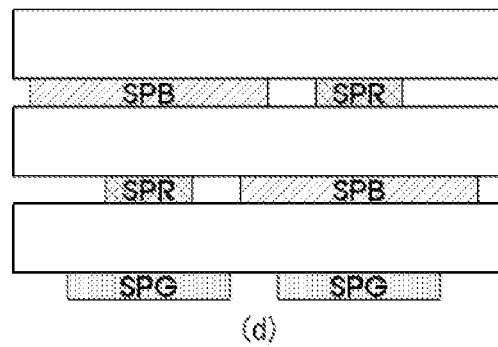
Figure 26:
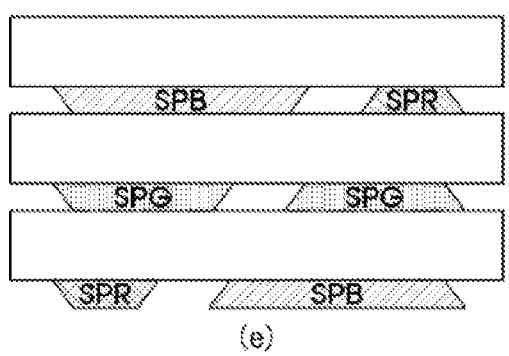
Figure 26:
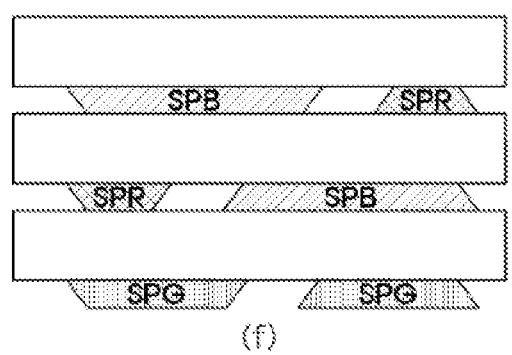
Figure 26:
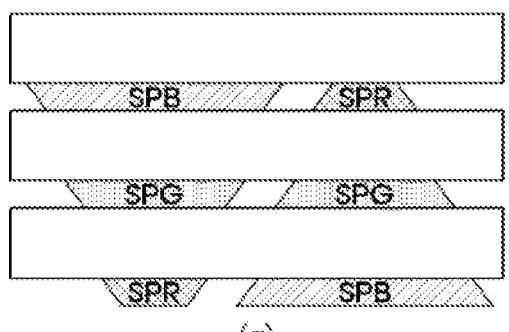
Figure 26:
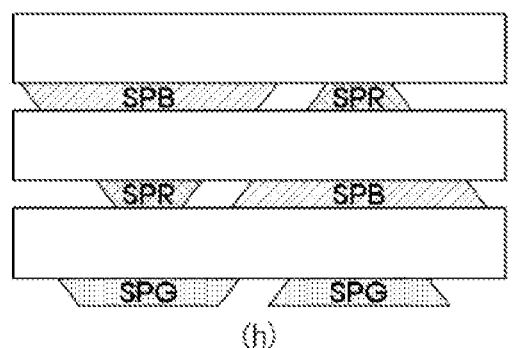

FIG. 26 is a diagram showing an example of a portion of a display panel according to aspects of the present disclosure.

As shown in FIG. 26, according to the present disclosure, a pixel of the display panel may be embodied based on at least one of the pixel structures 26A to 26H described above in the second to fifth aspects.

In a display panel according to a first example, pixels may be arranged based on a first pixel structure 26A, a second pixel structure 26B, or the first pixel structure 26A and the second pixel structure 26B (A detailed description related thereto is understood with reference to the third aspect).

In a display panel according to a second example, pixels may be arranged based on a third pixel structure 26C, a fourth pixel structure 26D, or the third pixel structure 26C and the fourth pixel structure 26D (A detailed description related thereto is understood with reference to the fourth aspect).

In a display panel according to a third example, pixels may be arranged based on a fifth pixel structure 26E, a sixth pixel structure 26F, or the fifth pixel structure 26E and the sixth pixel structure 26F (A detailed description related thereto is understood with reference to the fifth aspect).

In a display panel according to a fourth example, pixels may be arranged based on a seventh pixel structure 26G, an eighth pixel structure 26H, or the seventh pixel structure 26G and the eighth pixel structure 26H (A detailed description related thereto is understood with reference to the second aspect).

In a display panel according to a fifth example, pixels may be arranged based on at least two pixel structures (26A and 26D, 26C and 26H, etc.) selected among first to eight pixels 26A to 26H (A detailed description related thereto is understood with reference to the second to fifth aspects).

The present disclosure may overcome a problem in that an image displayed on a screen is reflected on a unwanted area (e.g., a front glass window of a vehicle), a problem in terms of degraded image quality, a problem in terms of degraded brightness, and a problem in terms of increase in the thickness of a product, and may also provide an optimum image. In addition, the viewing angle of the display panel may be changed without reduction in a front viewing angle or brightness (there is no structure that hinders emitted light of a pixel).

The present disclosure may overcome a problem in that an image displayed on a screen is reflected on a unwanted area (e.g., a front glass window of a vehicle), a problem in terms of degraded image quality, a problem in terms of degraded brightness, and a problem in terms of increase in the thickness of a product, and may also provide an optimum image. In addition, the viewing angle of the display panel may be changed without reduction in a front viewing angle or brightness (there is no structure that hinders emitted light of a pixel).

What is claimed is:

1. A display device comprising:
   a substrate;
   sub-pixels disposed on the substrate;
   a passivation layer disposed on the sub-pixels; and
   an emitted light control layer disposed on the passivation layer and defining a non-emissive area between the sub-pixels,
   wherein the emitted light control layer includes black matrix layers divided into at least two layers,
   wherein the sub-pixels include a red sub-pixel, a green sub-pixel, and a blue sub-pixel;
   wherein the red sub-pixel, the green sub-pixel, and the blue sub-pixel are arranged in a vertical direction and constitute one pixel; and
   wherein the red sub-pixel, the green sub-pixel, and the blue sub-pixel have sizes that are increased in the stated order.

2. The display device of claim 1, wherein the emitted light control layer further includes:
   a first black matrix layer positioned on the passivation layer;
   a first cover layer positioned on the first black matrix layer;
   a second black matrix layer positioned on the first cover layer; and
   a second cover layer positioned on the second black matrix layer.

3. The display device of claim 2, wherein the first black matrix layer and the second black matrix layer have a same width and a same length in a display area.

4. The display device of claim 2, wherein the first black matrix layer and the second black matrix layer have a region that overlaps with the sub-pixels or do not overlap with the sub-pixels.

5. The display device of claim 1, wherein the red sub-pixel, the green sub-pixel, and the blue sub-pixel have a trapezoid shape or a rectangular shape with a longer horizontal length than a vertical length.

6. The display device of claim 1, wherein the red sub-pixel, the green sub-pixel, and the blue sub-pixel are aligned with respect to a central area of a reference sub-pixel, one end of the reference sub-pixel, or the other end of the reference sub-pixel.

7. The display device of claim 1, wherein sub-pixels included in the one pixel are summed in a vertical direction to have a trapezoid shape.

8. The display device of claim 1, wherein the one pixel as an assembly of the red sub-pixel, the green sub-pixel, and the blue sub-pixel has a trapezoid shape.

9. The display device of claim 1, wherein the one pixel as an assembly of the red sub-pixel, the green sub-pixel, and the blue sub-pixel has a stepped shape.

10. The display device of claim 1, wherein the one pixel as an assembly of the red sub-pixel, the green sub-pixel, and the blue sub-pixel has a concave or convex central portion with respect to an upper end or a lower end.

11. The display device of claim 1, wherein two pixels adjacent in a horizontal direction of the substrate includes:
    a first group including two sub-pixels that emit light with different colors on a same line; and
    a second group including two sub-pixels that emit light with a same color on a same line.

12. The display device of claim 11, wherein the sub-pixels of the first group are the red sub-pixel and the blue sub-pixel, and the sub-pixels of the second group are the green sub-pixel.

13. The display device of claim 2, further comprising a polarizer plate positioned on the emitted light control layer.

14. The display device of claim 1, wherein the sub-pixels emit one of red, green, and blue light based on a color filter layer on an emissive layer that emits red, green, and blue light or emits white light.

15. A display device comprising:
    a display panel including sub-pixels;
    a first black matrix layer positioned on a passivation layer of the display panel;
    a first cover layer positioned on the first black matrix layer;
    a second black matrix layer positioned on the first cover layer; and
    a second cover layer positioned on the second black matrix layer,
    wherein the first black matrix layer and the second black matrix layer have a same width and a same length in a display area of the display panel,
    wherein the sub-pixels include a red sub-pixel, a green sub-pixel, and a blue sub-pixel;
    wherein the red sub-pixel, the green sub-pixel, and the blue sub-pixel are arranged in a vertical direction and constitute one pixel; and wherein the red sub-pixel, the green sub-pixel, and the blue sub-pixel have sizes that are increased in the stated order.

16. The display device of claim 15, wherein the first black matrix layer and the second black matrix layer have a region that overlaps with the sub-pixels or do not overlap with the sub-pixels.

17. The display device of claim 15, wherein the red sub-pixel, the green sub-pixel, and the blue sub-pixel have a trapezoid shape or a rectangular shape with a longer horizontal length than a vertical length.

18. The display device of claim 15, wherein the red sub-pixel, the green sub-pixel, and the blue sub-pixel are aligned with respect to a central area of a reference sub-pixel, one end of the reference sub-pixel, or the other end of the reference sub-pixel.

* * * * *